United States Patent
Li et al.

(10) Patent No.: US 9,397,313 B2
(45) Date of Patent: Jul. 19, 2016

(54) ORGANIC LIGHT EMITTING DIODE AND DISPLAY DEVICE USING THE SAME

(71) Applicant: InnoLux Corporation, Miao-Li County (TW)

(72) Inventors: Chun-Kai Li, Miao-Li County (TW); Hsin-Hui Wu, Miao-Li County (TW)

(73) Assignee: INNOLUX CORPORATION (TW)

( * ) Notice: Subject to any disclaimer, the term of this patent is extended or adjusted under 35 U.S.C. 154(b) by 0 days.

(21) Appl. No.: 14/625,087

(22) Filed: Feb. 18, 2015

(65) Prior Publication Data
US 2015/0255755 A1    Sep. 10, 2015

(30) Foreign Application Priority Data
Mar. 5, 2014    (TW) .............................. 103107408 A

(51) Int. Cl.
*H01L 35/24*    (2006.01)
*H01L 51/00*    (2006.01)
*H01L 51/52*    (2006.01)

(52) U.S. Cl.
CPC ........ *H01L 51/5268* (2013.01); *H01L 51/5275* (2013.01); *H01L 51/524* (2013.01)

(58) Field of Classification Search
CPC ......... H01L 35/24; H01L 51/00; H01L 51/52; H01L 51/5275; H01L 51/5203; H01L 51/56
USPC .................................................. 257/40
See application file for complete search history.

(56) References Cited

U.S. PATENT DOCUMENTS

| | | | | |
|---|---|---|---|---|
| 2012/0299474 A1* | 11/2012 | Tang | ..................... | C07D 209/86 313/504 |
| 2014/0264416 A1* | 9/2014 | Lu | ......................... | G02B 5/0242 257/98 |
| 2015/0008401 A1* | 1/2015 | Lee | ...................... | H01L 51/5275 257/40 |
| 2015/0021620 A1* | 1/2015 | Sung | ........................ | H01L 33/32 257/76 |
| 2015/0207104 A1* | 7/2015 | Mukunoki | ................ | B32B 3/30 136/256 |
| 2015/0236300 A1* | 8/2015 | Naraoka | .............. | H01L 51/5262 257/40 |

FOREIGN PATENT DOCUMENTS

CN    102097597 A    6/2011

* cited by examiner

*Primary Examiner* — Phuc Dang
(74) *Attorney, Agent, or Firm* — Bacon & Thomas, PLLC

(57) ABSTRACT

The present invention relates to an organic light emitting diode, comprising: a first electrode; a second electrode; an organic material layer which is interposed between the first electrode and the second electrode; and a light extraction layer which is disposed on the first electrode or under the second electrode, wherein the light extraction layer has a wave surface. The present invention also relates to a display device which comprises the above-mentioned organic light emitting diode.

14 Claims, 4 Drawing Sheets

ORGANIC LIGHT EMITTING DIODE AND DISPLAY DEVICE USING THE SAME

CROSS REFERENCE TO RELATED APPLICATION

This application claims the benefits of the Taiwan Patent Application Serial Number 103107408, filed on Mar. 5, 2014, the subject matter of which is incorporated herein by reference.

BACKGROUND OF THE INVENTION

1. Field of the Invention

The present invention relates to an organic light emitting diode and a display device using the same. More particularly, the present invention relates to an organic light emitting diode which is suitably applied to an OLED display and a display device using the same.

2. Description of Related Art

Organic light emitting diode (OLED) is a self-luminous device which has advantages of wide viewing angles, high contract, rapid response, and high brightness, and may provide a visual light with a wide range.

A basic structure of a conventional OLED includes an anode, an organic layer and a cathode which are sequentially disposed on a substrate. When electrons and holes from the cathode and the anode are respectively transported into the organic layer and are recombined with each other in the organic layer, light is emitted. Due to the difference between the refractive indexes of materials of the OLED and the difference between the refractive indexes of the OLED and the environment, most emitted light is trapped in the OLED and cannot emit to the outside, resulting in a decrease of the light extraction efficiency of the OLED. Therefore, for improving the light extraction efficiency of the OLED, many researchers made efforts to dissolve such problem by, for example, using a micro lens array (MLA), forming a specific crystalline pattern by photolithography and etching, or coating a light scattering layer on a side of a transparent electrode. However, the above-mentioned methods may cause the product cost increased due to a complicated process and the OLED degraded due to a solvent volatilization process. Thus, the above-mentioned methods are hard to wildly apply to all kinds of OLED.

Accordingly, there is a need to develop an OLED which is manufactured by a simple process and has high light extraction efficiency.

SUMMARY OF THE INVENTION

The object of the present invention is to provide an organic light emitting diode with improved light extraction efficiency thereof, which is fabricated by disposing a light extraction layer therein through a simple process.

To achieve the object, the present invention provides an organic light emitting diode, comprising: a first electrode; a second electrode; an organic material layer which may be interposed between the first electrode and the second electrode; and a light extraction layer which may be disposed on the first electrode or under the second electrode, wherein the light extraction layer has a wave surface.

In one aspect, the light extraction layer may be formed by an organic material through any method to make a surface thereof be the wave surface. For example, the light extraction layer having the wave surface may be formed by evaporating the organic material.

In one aspect, a roughness (Ra) of the wave surface may be 10 nm to 200 nm.

In one aspect, a thickness of the light extraction layer may be 10 nm to 500 nm.

In one aspect, the light extraction layer may be disposed on the first electrode and the wave surface may be formed on a side opposite to a side of the light extraction layer facing to the first electrode.

In one aspect, the organic light emitting diode may further comprise a passivation layer disposed on the light extraction layer.

In one aspect, the passivation layer may have a wave surface and a roughness of the wave surface thereof may be 50 nm to 200 nm. Preferably, the roughness of the wave surface thereof may be 50 nm to 100 nm.

In one aspect, the light extraction layer may be disposed under the second electrode and the wave surface of the light extraction layer may be locate on a side of the light extraction layer facing to the second electrode.

In one aspect, the first electrode may be a transparent electrode.

In one aspect, the first electrode may be a metal electrode.

In one aspect, the second electrode may be a transparent electrode.

In one aspect, the organic light emitting diode may further comprises a reflective layer, and the reflective layer may be disposed on an appropriate position according to the position of the light extraction layer and the type of the organic light emitting diode. For example, the reflective layer may be disposed on the first electrode or may be disposed between the second electrode and the light extraction layer.

In one aspect, the organic light emitting diode may further comprise a planarization layer disposed on a side opposite to a side of the light extraction layer facing to the second electrode.

In addition, the present invention further provides a display device comprising the above-mentioned organic light emitting diode, comprising: a substrate; and the above-mentioned organic light emitting diode which may be disposed on the substrate, wherein the substrate may be a transparent substrate (for example, glass substrate and plastic substrate) or an opaque substrate according to the type of the selected organic light emitting diode, but the present invention is not particularly limited thereto. Accordingly, the display device including the above-mentioned organic light emitting diode with the light extraction layer having the wave surface of the present invention can exhibit excellent effect.

DETAILED DESCRIPTION OF THE PREFERRED EMBODIMENT

Figure 1A:
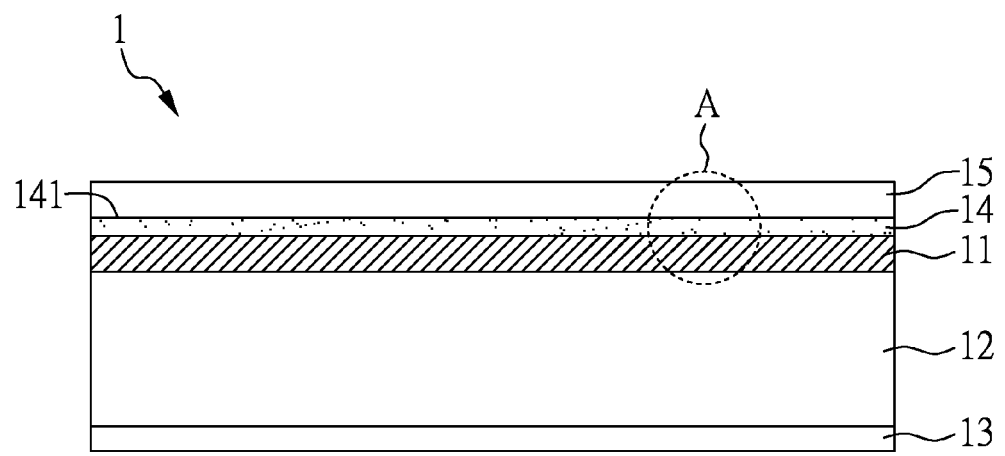
FIG. 1A shows the schematic structure of the organic light emitting diode 1 according to Example 1 of the present invention.

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention, and those skilled in the art will appreciate that various modifications, additions and substitutions are possible.

In the present invention, any organic material may be selected without any limitation, as long as it may be used to form a light extraction layer with a wave surface. In general, a material having a low molecular weight in a range from 100 g/mol to 500 g/mol (100 g/mol≤Mw≤500 g/mol), a planar molecular structure and a low glass transition temperature in a range from 50° C. to 100° C. (50° C.≤Tg≤100° C.) may be used as the organic material of the light extraction layer. For example, the organic material may include 2,2',7,7'-tetrakis (diphenylamino)-9,9'-spiro-bifluorene (spiro-TAD), 2,2',7, 7'-tetra(N,N-ditolyl)amino-9,9-spirobifluorene (spiro-TTB), (Hexaazatriphenylene-hexacabonitrile (HAT-CN), Titanyl phthalocyanine (TiOPC), 2,9-Bis(naphthalen-2-yl)-4,7-diphenyl-1,10-phenanthroline (NBphen), Bathophenanthroline (Bphen), N,N,N',N'-tetraphenyl-[9,9'-bianthracene]-10, 10'-diamine (BA-TAD), 2,2',7,7'-tetrakis(carbazol-9-yl)-9,9-spirobifluorene (spiro-CBP), and a combination thereof, but the present invention is not particularly limited thereto. Further, a person skilled in the art can appropriately select the processes and the conditions thereof for forming the light extraction layer according to the used materials based on the conventional knowledge in the art. The present invention is not particularly limited thereto and the detail processes and the conditions thereof are not described herein.

In the present invention, when the roughness of the wave surface of the light extraction layer is controlled within the above-mentioned range from 10 nm to 200 nm, preferably 50 nm to 200 nm and more preferably 65 nm to 200 nm, each functional layer of the organic light emitting diode formed thereon may form a similar wave surface, an thus the improved light extraction efficiency of the organic light emitting diode may be achieved. In addition, in order to satisfy the transmittance and improve the light extraction efficiency at the same time, the thickness of the light extraction layer may be controlled within the above-mentioned range from 10 nm to 500 nm, preferably 50 nm to 500 nm, more preferably 100 nm to 500 nm.

In the present invention, any conventional electrode material suitable for the electrode material of the organic light emitting diode may be used, and the present invention is not particularly limited thereto. For example, the first electrode and the second electrode may be respectively a transparent electrode or a metal electrode according to the type of the organic light emitting diode, but the present invention is not particularly limited thereto. However, based on the general knowledge of the organic light emitting diode, at least one of the first electrode and the second electrode may be the transparent electrode. Furthermore, the materials of the transparent electrode of the present invention are not particularly limited and, for example, indium tin oxide (ITO) and indium zinc oxide (IZO) can be used herein. In addition, the metal electrode may also be used as a reflective layer when the material thereof is appropriately selected. In this case, there is no need to dispose a reflective layer in the organic light emitting diode, additionally. With respect to the materials of the metal electrode and the reflective layer, any conventional materials in the art may be used, and are not illustrated herein.

In the present invention, the contents of the organic layer and the structure thereof are not particularly limited thereto, and can be any conventional contents and structures used in the organic layer of the organic light emitting diode. For example, the organic layer may be composed of an electron injection layer, an electron transport layer, a light emitting layer, a hole transport layer and a hole injection layer. Further, the present invention may not particularly limit the kinds of the emitting light, and the examples of the emitting light comprise red light, green light, blue light and white light. In addition, the OLED of the present invention may comprise other functional layer used in the art, such as passivation layer, encapsulate layer, substrate and planarization layer, but the present invention is not particularly limited thereto.

As the mention above, the light extraction layer with the wave surface may be disposed in any conventional type of the organic light emitting diode such as top emitting OLEDs, bottom emitting OLEDs or both side emitting OLEDs. According to the above-mentioned type of the organic light emitting diode and the process thereof, the light extraction layer may be disposed at an appropriate position therein. For example, the light extraction layer may be disposed on the first electrode or under the second electrode, but the present invention is not limited thereto.

Hereinafter, the present invention will be particularly described through the following examples.

EXAMPLE 1

FIG. 1A shows the schematic structure of the organic light emitting diode 1 of the present example. The organic light emitting diode 1 includes: a first electrode 11; a second electrode 13; an organic layer 12 which is interposed between the first electrode 11 and the second electrode 13; a light extraction layer 14 which is disposed on the first electrode 11; and a passivation layer 15 which is disposed on the light extraction layer 14, wherein the light extraction layer 14 has a wave surface 141 on the side opposite to a side of the light extraction layer 14 facing to the first electrode 11.

In Example 1, the organic light emitting diode 1 may further include a reflective layer (not shown in the figure) which is disposed under the second electrode 13. Therefore, the organic light emitting diode 1 may be a top emitting OLED.

Further, the organic light emitting diode 1 may be manufactured by any conventional method in the art. For example, it may be prepared by a thermal evaporation under $9\times10^{-6}$ torr, and a person skilled in the art can change the process conditions and parameters of each functional layer according to the selected materials of each functional layer. Herein, the present invention is not particularly limited thereto, and the process conditions and the parameters are not illustrated. In particular, first, a metal layer is deposited on a surface of a substrate (not shown in the figure) as a reflective layer (not shown in the figure) and an ITO layer is deposited thereon as the second electrode 13. Then, the hole injection layer, the hole transport layer, the light emitting layer, the electron transport layer and the electron injection layer are sequentially deposited to form the organic layer 12. Then, a semi-transparent layer is deposited on the electron injection layer as the first electrode 11 and at least one selected from the above-mentioned organic materials is further deposited thereon to form the light extraction layer 14 with the wave surface 141. Finally, silicon nitride is deposited on the light extraction layer 14 as a passivation layer 15 to obtain the organic light emitting diode 1. In addition, a protective glass and a UV epoxy resin (not shown in the figure) may be used to encapsulate the organic light emitting diode 1 with the above-mentioned substrate under nitrogen atmosphere for protecting the organic light emitting diode 1.

Figure 1B:
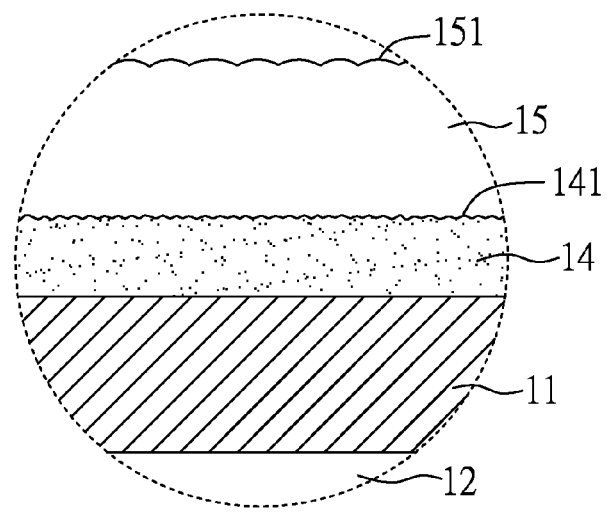
FIG. 1B shows the enlarged view of the A part of the organic light emitting diode 1 according to Example 1 of the present invention.

FIG. 1B shows the enlarged view of the A part of the organic light emitting diode 1 of the present example. The light extraction layer 14 deposited on the first electrode 11 has a thickness of 10 nm to 500 nm. Because the wave surface 141 thereof has a roughness of 10 nm to 200 nm, the passivation layer 15 formed thereon also has a wave surface 151 with a roughness of 50 nm to 100 nm. Therefore, through controlling the thickness of the light extraction layer and the roughness of the wave surface thereof within the above-mentioned range, the passivation layer formed thereon may also have the similar wave surface. Thus, the light extraction efficiency of the organic light emitting diode 1 may be improved.

EXAMPLE 2

Figure 2A:
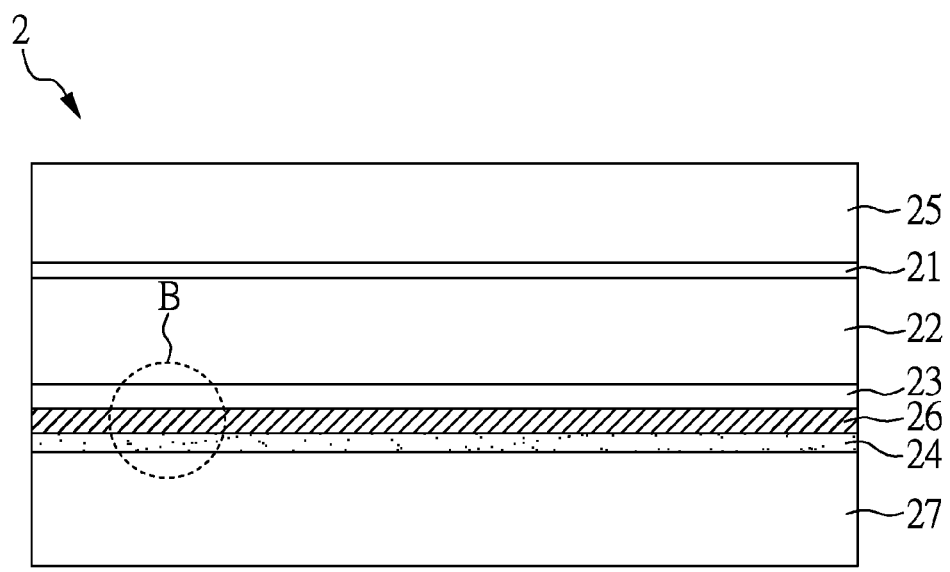
FIG. 2A shows the schematic structure of the organic light emitting diode 2 according to Example 2 of the present invention.

FIG. 2A shows the schematic structure of the organic light emitting diode 2 of the present example. The organic light emitting diode 2 is a top emitting OLED, comprising: a first electrode 21; a second electrode 23; an organic layer 22 which is interposed between the first electrode 21 and the second electrode 23; a light extraction layer 24 which is disposed under the second electrode 23; a passivation layer 25 which is disposed on the first electrode 21; a reflective layer 26 which is interposed between the second electrode 23 and the light extraction layer 24; and a planarization layer 27 disposed on a side opposite to a side of the light extraction layer 24 facing to the second electrode 23; wherein the light extraction layer 24 has a wave surface 241 on a side of the light extraction layer 24 facing to the second electrode 23.

Similarly, the organic light emitting diode 2 may be also manufactured by any conventional method in the art. For example, it may be prepared by a thermal evaporation under $9 \times 10^{-6}$ torr, and a person skilled in the art can change the process conditions and parameters of each functional layer according to the selected materials of each functional layer. Herein, the present invention is not particularly limited thereto and the process conditions and the parameters are not illustrated. In particular, first, the planarization layer 27 is formed on a surface of a substrate (not shown in the figure), and then at least one selected from the above-mentioned organic materials is deposited on the surface of the planarization layer 27 to form the light extraction layer 24 with the wave surface 241. Then, the reflective layer 26, the second electrode 23, the organic layer 22 and the first electrode 21 are sequentially deposited thereon, wherein the first electrode 21 is a semi-transparent layer deposited on the organic layer 22 and the second electrode 23 is a transparent electrode formed by ITO. Finally, silicon nitride is deposited on the first electrode 21 as a passivation layer 25 to obtain the organic light emitting diode 2. Through the similar process described in Example 1, a protective glass and a UV epoxy resin (not shown in the figure) may be used to encapsulate the organic light emitting diode 2 with the above-mentioned substrate under nitrogen atmosphere for protecting the organic light emitting diode 2.

Figure 2B:
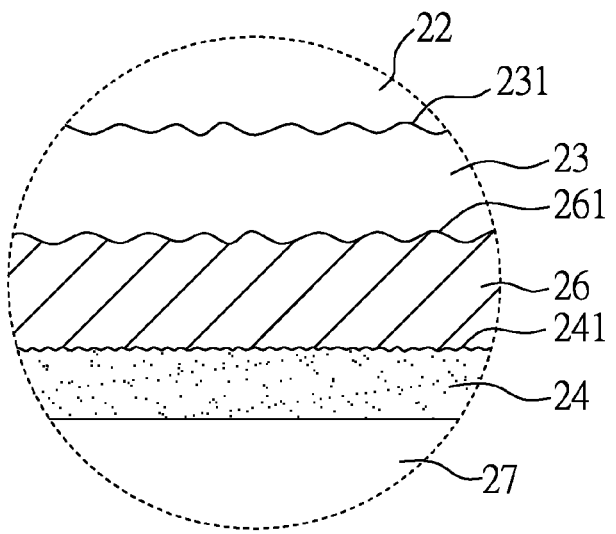
FIG. 2B shows the enlarged view of the B part of the organic light emitting diode 2 according to Example 2 of the present invention.

FIG. 2B shows the enlarged view of the B part of the organic light emitting diode 2 of the present example. The light extraction layer 24 deposited on the planarization layer 27 has a thickness of 10 nm to 500 nm. Because the wave surface 241 thereof has a roughness of 10 nm to 200 nm, the reflective layer 26, the second electrode 23, the organic layer 22, the first electrode 21 and the passivation layer 25 formed thereon also have similar structures, wherein a wave surface 251 of the passivation layer 25 has a roughness of 50 nm to 100 nm. Therefore, through disposing the light extraction layer with the wave surface having the roughness within the above-mentioned range, each functional layer of the organic light emitting diode formed thereon may also have the similar wave surfaces. Thus, the light extraction efficiency of the organic light emitting diode 2 can also be improved.

EXAMPLE 3

In Example 3, the process for fabricating the OLED is similar to that illustrated in Example 2 except that a transparent substrate is used in the process of the present example which is similar to the process of Example 2, the reflective layer is not disposed, and a metal with reflective function (i.e. Al) is used to form the first electrode herein. Therefore, the organic light emitting diode prepared in Example 3 may be a bottom emitting OLED.

COMPARATIVE EXAMPLE

An organic light emitting diode of Comparative Example is similar to that of Example 1 except that the organic light emitting diode of Comparative Example does not have the light extraction layer of Example 1.

EXAMPLE 4

Figure 3:
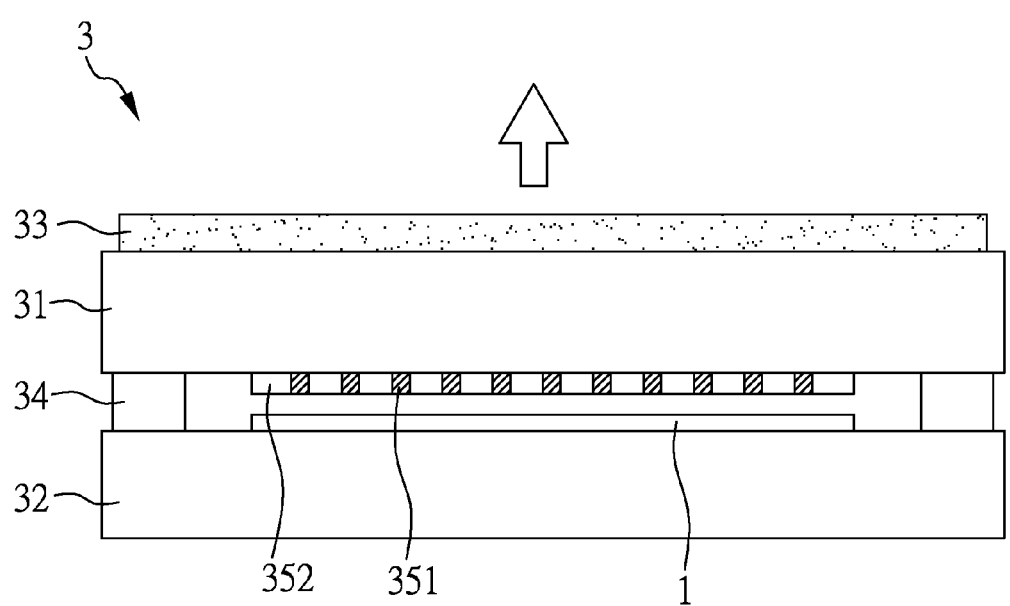
FIG. 3 shows the schematic structure of the display device 3 according to Example 4 of the present invention.

FIG. 3 shows the schematic structure of the display device 3 of the present example. As shown in FIG. 3, the display device of Example 4 includes: a substrate 32; and an organic light emitting diode 1 which is disposed on the substrate 32.

In Example 4, the organic light emitting diode 1 may be the organic light emitting diode of Example 1 or Example 2, and thus the detail structure thereof are not illustrated herein. Both of the organic light emitting diodes of Example 1 and Example 2 are top emitting OLEDs. The side opposite to an illuminating surface, that is, the side of the second electrode or the planarization layer, is disposed on the substrate 32. Also, the display device 3 further includes: a transparent substrate 31, a plurality of spacers 351, a plurality of color filter elements 352, and a sealing element 34. Herein, the spacers 351 are interposed between two adjacent color filter elements 352 for preventing a light crosstalk between the two adjacent color filter elements 352. The organic light emitting diode 1 is disposed between the transparent substrate 31 and the substrate 32 and is encapsulated by the sealing element 34. Herein, the spacers 351 may be a conventional black matrix. However, in some case, the display device 3 of Example 4 may also not have to be equipped with the spacers 351 and the color filter elements 352.

In addition, for decreasing the reflection of the environment light and improving the contract, a polarizing element 33 may be selectively disposed on the side of the illuminating surface of the display device, that is, the other side of the transparent substrate 31 with the spacers 351 and the color filter elements 352 disposed thereon. However, in some case, the display device 3 of Example 4 may also not have to be equipped with the polarizing element 33.

TEST EXAMPLE

Table 1 shows results of light extraction efficiency of the organic light emitting diodes of Example 1 and Comparative Example, wherein each result is shown the efficiency of the present invention by a percent manner based on the each value of Comparative Example. As shown in Table 1, luminance ($cd/cm^2$), luminous efficiency (cd/A), power efficiency (lm/W) and external quantum efficiency of the organic light emitting diode of Example 1 are significantly improved under the same current density ($mA/cm^2$), indicating that the light extraction efficiency of the organic light emitting diode may be significantly improved by disposing the light extraction layer with the wave surface having a roughness of 10 nm to 200 nm therein.

Figure 4:
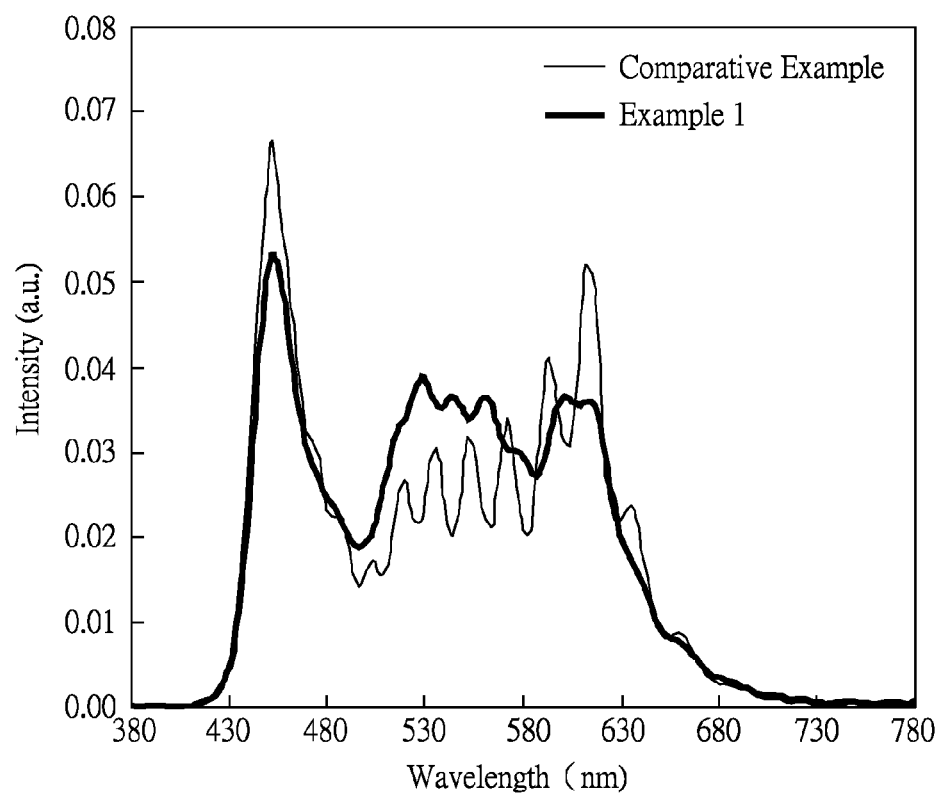
FIG. 4 shows the spectrum according to Example 1 of the present invention.

FIG. 4 shows the spectrum according to the organic light emitting diodes of Example 1 and Comparative Example. As shown in FIG. 4, the spectrum of the light emitting from the organic light emitting diodes of Example 1 has smoother shape than Comparative Example cause overall intensity increase, indicating that the disposition of the light extraction layer enhance the viewing angle and the luminance of the organic light emitting diode.

TABLE 1

|  | luminance (cd/cm2) | luminous efficiency (cd/A) | power efficiency (lm/W) | CIE(x) | CIE(y) | ΔE @45(x,y) | external quantum efficiency |
| --- | --- | --- | --- | --- | --- | --- | --- |
| Comparative Example | 100% | 100% | 100% | 100% | 100% | 100% | — |
| Example 1 | 117% | 117% | 109% | 97% | 113% | 73% | 24.57% |

Although the present invention has been explained in relation to its preferred embodiment, it is to be understood that many other possible modifications and variations can be made without departing from the spirit and scope of the invention as hereinafter claimed.

What is claimed is:

1. An organic light emitting diode, comprising:
   a first electrode;
   a second electrode;
   an organic material layer which is interposed between the first electrode and the second electrode; and
   a light extraction layer which is disposed on the first electrode or under the second electrode,
   wherein the light extraction layer has a wave surface, the wave surface of the light extraction layer is formed by evaporating an organic material, and the organic material has a molecular weight between 100 g/mol and 500 g/mol.

2. The organic light emitting diode as claimed in claim 1, wherein a roughness of the wave surface is 10 nm to 200 nm.

3. The organic light emitting diode as claimed in claim 1, wherein a thickness of the light extraction layer is 10 nm to 500 nm.

4. The organic light emitting diode as claimed in claim 1, wherein the light extraction layer is disposed on the first electrode and the wave surface is formed on a side opposite to a side of the light extraction layer facing to the first electrode.

5. The organic light emitting diode as claimed in claim 4, wherein the organic light emitting diode further comprises a passivation layer disposed on the light extraction layer.

6. The organic light emitting diode as claimed in claim 5, wherein the passivation layer has a wave surface and a roughness of the undulating surface is 50 nm to 200 nm.

7. The organic light emitting diode as claimed in claim 1, wherein the light extraction layer is disposed under the second electrode and the wave surface is formed on a side of the light extraction layer facing to the second electrode.

8. A display device, comprising:
   a substrate;
   an organic light emitting diode, which is disposed on the substrate and comprises:
   a first electrode;
   a second electrode;
   an organic material layer which is interposed between the first electrode and the second electrode; and
   a light extraction layer which is disposed on the first electrode or under the second electrode,
   wherein the light extraction layer has a wave surface, the wave surface of the light extraction layer is formed by evaporating an organic material, and the organic material has a molecular weight between 100 g/mol and 500 g/mol.

9. The display device as claimed in claim 8, wherein a roughness of the wave surface is 10 nm to 200 nm.

10. The display device as claimed in claim 8, wherein a thickness of the light extraction layer is 10 nm to 500 nm.

11. The display device as claimed in claim 8, wherein the light extraction layer is disposed on the first electrode and the wave surface is formed on a side opposite to a side of the light extraction layer facing to the first electrode.

12. The display device as claimed in claim 11, wherein the organic light emitting diode further comprises a passivation layer disposed on the light extraction layer.

13. The display device as claimed in claim 12, wherein the passivation layer has a wave surface and a roughness of the undulating surface is 50 nm to 200 nm.

14. The display device as claimed in claim 8, wherein the light extraction layer is disposed under the second electrode and the wave surface is formed on a side of the light extraction layer facing to the second electrode.

* * * * *